United States Patent [19]

Falls

[11] 4,013,950

[45] Mar. 22, 1977

[54] APPARATUS FOR MEASURING THE ELECTROMAGNETIC IMPEDANCE OF SOILS

[75] Inventor: Robert A. Falls, Lorton, Va.

[73] Assignee: The United States of America as represented by the Secretary of the Army, Washington, D.C.

[22] Filed: Apr. 12, 1976

[21] Appl. No.: 676,099

[52] U.S. Cl. ............................... 324/58.5 R; 324/5
[51] Int. Cl.² ..................................... G01R 27/04
[58] Field of Search ................ 324/58.5 R, 58.5 A, 324/58.5 B, 58.5 C, 5

[56] References Cited

UNITED STATES PATENTS

| | | | |
|---|---|---|---|
| 2,455,940 | 12/1948 | Muskat et al. | 324/58.5 A X |
| 2,455,942 | 12/1948 | Coggeshall et al. | 324/58.5 A X |
| 2,489,092 | 11/1949 | Larrick | 324/58.5 C |
| 3,114,875 | 12/1963 | Haagensen | 324/5 X |

*Primary Examiner*—Stanley T. Krawczewicz
*Attorney, Agent, or Firm*—Nathan Edelberg

[57] ABSTRACT

Apparatus for measuring the electromagnetic (E/M) impedance of soil is disclosed. This impedance is obtained by measuring the voltage standing wave ratio and first minimum with the disclosed apparatus. The apparatus comprises a trombone slotted line in combination with an earth probe. The trombone slotted line comprises a telescoping outer conductor and a telescoping inner conductor coaxial with and surrounded by the outer conductor. The inner part of the telescoping outer conductor has a slot along its length and a probe that passes through the outer part of the telescoping outer conductor extends into this slot. The earth probe also comprises an outer conductor and a coaxial inner conductor surrounded by the outer conductor. One end of the inner telescoping conductor of the slotted line mates with the inner conductor of the earth probe and the other end of the telescoping inner conductor of the slotted line is coupled to coupling means for coupling RF energy to the apparatus. The outer conductor of the trombone slotted line is secured to the outer conductor of the earth probe. A rack and pinion gear arrangement is provided on the outer conductor of the slotted line to telescope the slotted line.

10 Claims, 4 Drawing Figures

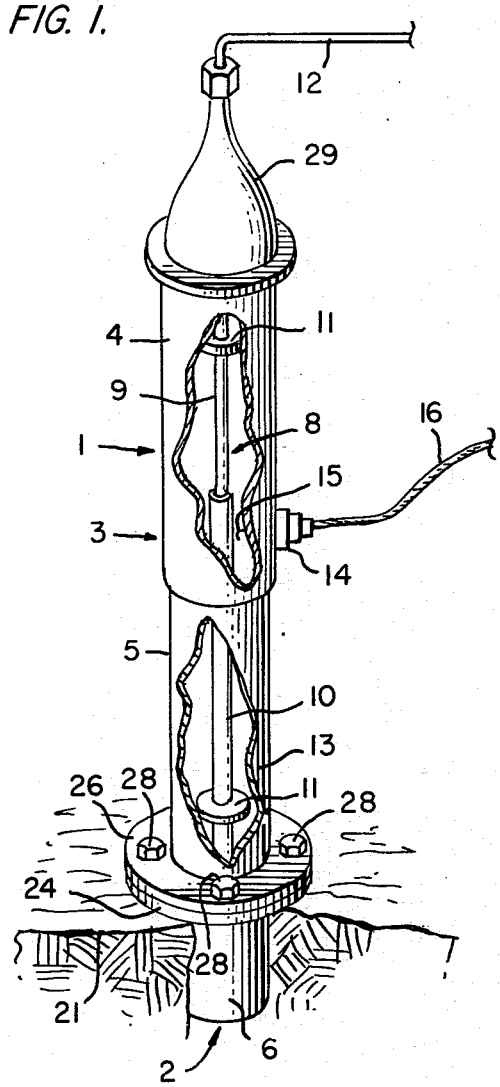
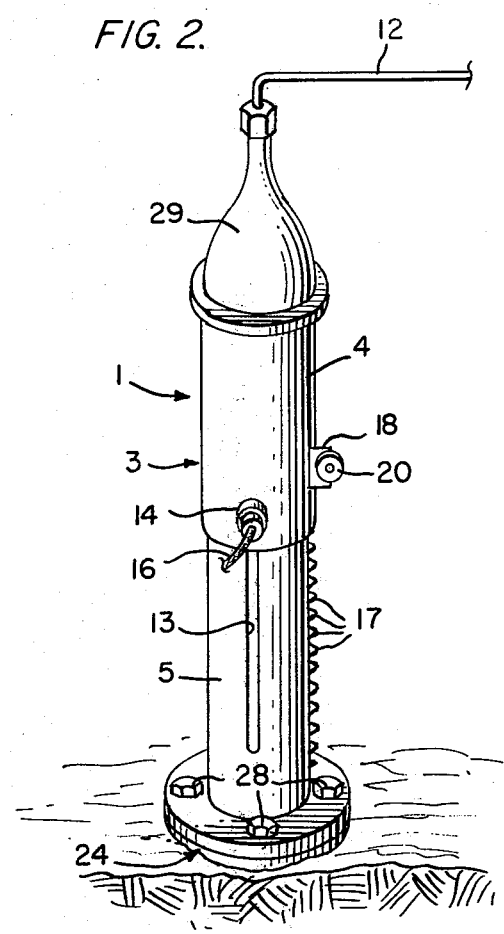
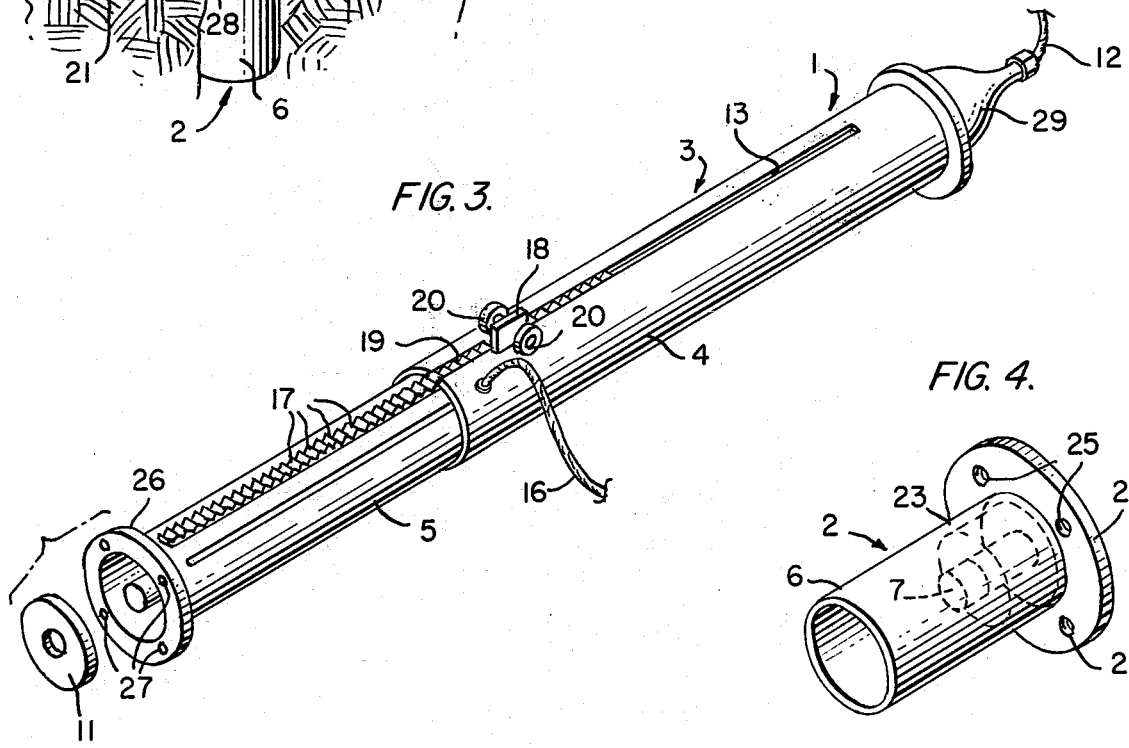
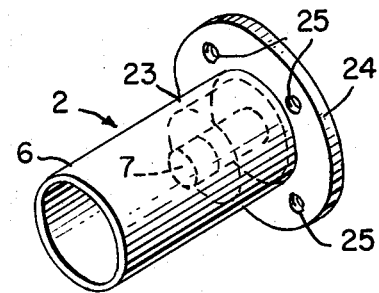

APPARATUS FOR MEASURING THE ELECTROMAGNETIC IMPEDANCE OF SOILS

The invention described herein may be manufactured, used and licensed by or for the Government for Governmental purposes without the payment to me of any royalties thereon.

BACKGROUND OF THE INVENTION

This invention relates to measuring the electromagnetic (E/M) characteristics of soils, and, more particularly, to a trombone slotted line earth probe combination for measuring the E/M characteristics of soils.

One method of obtaining the propagation constant and other RF electrical characteristics of soil in a given area is to measure the electromagnetic (E/M) characteristics of the soil in that area. Such measurements will provide, among other characteristics, the propagation constant of the soil, since knowledge of the E/M impedance of the soil in a given area is tantamount to knowing the propagation constant of that soil. Prior to this invention, field measurements of the E/M characteristics of soil have generally been obtained by utilizing modified standard laboratory equipment for this field work. This modified laboratory equipment generally includes a standard slotted line, a tripod used to support a standard slotted line, a voltage standing wave ratio meter, rigid transmission line coupled between the slotted line, an in-situ earth probe and a VHF/UHF generator. While this combination of equipment provides satisfactory measurements, the mechanical procedures for setting up and taking down the equipment are very time consuming. These mechanical procedures take up to as much as 60% of the total "on site" time.

This invention provides apparatus for making field measurements of the E/M characteristics of soil that is readily set up and taken down. Very little of the "on site" time is spent to set up and take down the apparatus of this invention. Further, the apparatus is so designed that the detector probe is easily moved up and down along the line to measure the voltage standing wave ratio and first null.

SUMMARY OF THE INVENTION

This invention comprises a trombone slotted line in combination with an earth probe for measuring the electromagnetic characteristics of the soil. The earth probe which comprises an outer conductor and a coaxial inner conductor is driven into the earth. The trombone slotted line which comprises a telescoping outer conductor and a telescoping inner conductor coaxial with the telescoping outer conductor is secured to the earth probe such that one end of the telescoping inner conductor of the trombone slotted line mates with the inner conductor of the earth probe and such that the telescoping outer conductor of the trombone slotted line is in electrical contact with the outer conductor of the earth probe. In order to secure these parts together in this manner, a flange is formed at the bottom end of the outer conductor of the trombone slotted line and a mating flange is formed at the top end of the earth probe.

The inner part of the telescoping outer conductor of the trombone slotted line has a slot along its length and a detector probe which passes through the outer part of the telescoping outer conductor extends into this slot.

An RF generator is coupled to the trombone slotted line and a voltage standing wave ratio meter is coupled to the detector probe. The trombone slotted line is then telescoped in and out to measure the voltage standing wave ratio and the first null.

BRIEF DESCRIPTION OF THE DRAWING

A full and complete understanding of the structural details and mode of operation of the invention can be obtained from the following detailed description when read in conjunction with the annexed drawing in which:

FIG. 1 shows a preferred embodiment of the invention in its operating position with a portion of the outer conductor of the trombone slotted line cut away to show the inner conductor and probe and with a section of the earth cut away to show the earth probe;

FIG. 2 is another view of the preferred embodiment of the invention shown in its operating position;

FIG. 3 shows the trombone slotted line of the preferred embodiment of FIGS. 1 and 2 separated from the earth probe; and FIG. 4 shows the earth probe of the preferred embodiment of FIGS. 1 and 2 removed from the ground and separated from the trombone slotted line.

DETAILED DESCRIPTION OF THE INVENTION

Referring to the drawing, FIG. 1 shows a preferred embodiment of the invention in its operating position with a portion of the outer conductor 3 of the trombone slotted line 1 cut away to expose the elements inside outer conductor 3 and with a portion of the ground 21 cut away to expose the earth probe 2. FIG. 2 is another view of the preferred embodiment. In this view, the apparatus is rotated slightly from the view of FIG. 1 in order to show some elements either not visible or not clearly visible in FIG. 1. In FIG. 3, trombone slotted line 1 is shown separated from earth probe 2 and in FIG. 4, earth probe 2 is shown removed from ground 21 and separated from trombone slotted line 1.

As shown in the drawing, trombone slotted line 1 comprises outer conductor 3 which is made up of a cylindrical conductor 4 and a cylindrical conductor 5. Cylindrical conductor 4 telescopes over cylindrical conductor 5. Housed inside outer conductor 3 is an inner conductor 8 which also comprises a first cylindrical conductor 9 and a second cylindrical conductor 10 which telescopes over cylindrical conductor 9. Inner conductor 8 is coaxial with outer conductor 3 and is held in place inside inner conductor 3 by means of the spacers 11.

An RF energy coupler 29 which may conveniently be a transformer is secured by any suitable means to the top of cylindrical conductor 4 of outer conductor 3. RF energy coupler 29 is coupled to a source of RF energy such as an RF generator by means of the lead 12. Although not visible in any of the Figures, inner conductor 8 is, of course, coupled to energy coupler 29 in any well known manner. Cylindrical conductor 5 of outer conductor 3 has a slot 13 cut along a substantial portion of its length. A voltage standing wave ratio meter is coupled to trombone slotted line 1 through the line 16, a diode 14 and a detector probe 15. Detector probe 15 extends into the space between outer conductor 3 and inner conductor 8 in such a manner that detector probe 15 is in close proximity to inner conductor 8. Line 16 and diode 14 are secured to cylindrical conductor 4 of outer conductor 3 by any suitable means with detector probe 15 passing through cylindrical conductor 4.

As mentioned, cylindrical conductor 4 slides over cylindrical conductor 5 thereby rendering outer conductor 3 telescopic. Inner conductor 8 is also, as previously mentioned, telescopic by virtue of the fact that cylindrical conductor 10 slips over cylindrical conductor 9. In order to telescope trombone slotted line 1 and to hold outer conductor 3 and inner conductor 8 in any position to which they have been telescoped, a gearing arrangement comprising a rack 17 and a pinion 18 is provided. Rack 17 is formed on cylindrical conductor 5 of outer conductor 3 and a guide slot 19 is formed in cylindrical conductor 4 of outer conductor 3 to permit cooperation between rack 17 and pinion 18. The hand knobs 20 are provided to operate rack 17 and pinion 18 to telescope trombone slotted line 1.

Earth probe 2 which is driven into ground 21 as is shown in FIGS. 1 and 2 comprises an outer conductor 6 and an inner conductor 7 that is coaxial with outer conductor 6. To facilitate the driving of earth probe 2 into the earth, outer conductor 6 is provided with a sharp edge. Inner conductor 7 may be provided with a point (not shown) affixed to its end to help drive earth probe 2 into the ground. Such a point is not necessary but can be provided, if desired. Inner conductor 7 of earth probe 2 is held in place inside outer conductor 6 by, for example, a potting resin 23. Any other suitable means can, of course, be used but potting resin 23 serves this purpose very handily and the use of potting resin is therefore preferable.

A flange 24 is formed integral with outer conductor 6 of earth probe 2. A plurality of holes 25 are drilled through flange 24. When earth probe 2 is driven into the ground, flange 24 rests on the surface of the earth as is shown in FIGS. 1 and 2. Trombone slotted line 1 is also provided with a flange 26 which is formed integral with cylindrical conductor 5 of outer conductor 3. A plurality of holes 27 are also drilled through flange 26 of outer conductor 3. When trombone slotted line 1 and earth probe 2 are assembled, holes 25 and 27 are lined up and suitable fastening devices such as the bolts 28 are used to secure trombone line 1 to earth probe 2. Holes 25 of flange 24 can be and are preferably threaded to accommodate bolts 28 or nuts can be used with bolts 28. As mentioned, the threading of holes 25 of flange 24 is preferred since it would be difficult to fasten nuts to bolts 28 after earth probe 2 is driven into earth 21. Inner conductor 7 of earth probe 2 is preferably hollow at least a short distance from the top of this conductor and is slightly larger in diameter than cylindrical conductor 10 of inner conductor 8 of trombone slotted line 1 so that cylindrical conductor 10 slips inside outer conductor 7 to make good electrical contact when trombone slotted line 1 and earth probe 2 are assembled. However, cylindrical conductor 10 could just abut inner conductor 7. Although not apparent from the drawing, inner conductor 7 protrudes slightly above flange 24.

The apparatus of this invention is utilized to measure the E/M characteristics of soil as follows: (1) Earth probe 2 is driven into the ground, (2) Trombone slotted line 1 is secured to earth probe 2 by bolts 28 with cylindrical conductor 10 slipped into an abutting inner conductor 7, (3) An RF source such as an RF generator and a voltage standing wave ratio meter are coupled to trombone slotted line 1 through leads 12 and 16.

I claim:

1. Apparatus for measuring the electromagnetic characteristics of soil comprising:

a. a telescopic slotted line having a telescopic outer conductor and a telescopic inner conductor surrounded by and coaxial with said telescopic outer conductor,
   b. an earth probe having an outer conductor and an inner conductor surrounded by and coaxial with said outer conductor, and
   c. means to electrically secure said telescopic slotted line to said earth probe.

2. Apparatus for measuring the electromagnetic characteristics of soil as defined in claim 1 wherein said telescopic outer conductor comprises a first hollow cylindrical conductor and a second hollow cylindrical conductor that slides over said first cylindrical conductor.

3. Apparatus for measuring the electromagnetic characteristics of soil as defined in claim 2 wherein said first cylindrical conductor of said telescopic outer conductor has a slot cut through its surface substantially along its entire length.

4. Apparatus for measuring the electromagnetic characteristics of soil as defined in claim 3 wherein said telescopic inner conductor comprises a first cylindrical conductor and a second cylindrical conductor that slips over said first cylindrical conductor, said telescopic inner conductor being held in place inside said telescopic outer conductor by means of spacers that surround said telescopic inner conductor and frictionally engage the inside wall of said first hollow cylindrical conductor and said second hollow cylindrical conductor of said telescopic outer conductor.

5. Apparatus for measuring the electromagnetic characteristics of soil as defined in claim 4 wherein an RF energy coupler is secured to said second hollow cylindrical conductor and wherein one end of said telescopic inner conductor is electrically coupled to said RF energy coupler.

6. Apparatus for measuring the electromagnetic characteristics of soil as defined in claim 5 wherein a detector probe passes through said second hollow cylindrical of said telescopic outer conductor such that one end of said probe is in close proximity to said telescopic inner conductor.

7. Apparatus for measuring the electromagnetic characteristics of soil as defined in claim 6 wherein said detector probe is coupled to a diode and means are provided to couple said detector probe and said diode to a measuring device.

8. Apparatus for measuring the electromagnetic characteristics of soil as defined in claim 7 wherein a rack and pinion gear arrangement are provided on said telescopic outer conductor to telescope said telescopic outer conductor and said telescopic inner conductor.

9. Apparatus for measuring the electromagnetic characteristics of soil as defined in claim 8 wherein said means to electrically secure said telescopic slotted line to said earth probe comprises a first flange integrally formed at one end of said first hollow cylindrical conductor of said telescopic outer conductor and a second flange integrally formed with one end of said outer conductor of said earth probe, said first and second flanges each having a plurality of holes that are aligned to accommodate fastening means to physically as well as electrically secure said telescopic slotted line to said earth probe.

10. Apparatus for measuring the electromagnetic characteristics of soil as defined in claim 9 wherein said outer conductor of said earth probe is a hollow cylindrical conductor and said inner conductor of said earth probe is a cylindrical conductor that is held in place inside said hollow outer conductor of said earth probe by means of a resinous material.

* * * * *